United States Patent
Dades

[11] 3,992,669
[45] Nov. 16, 1976

[54] RADIO FREQUENCY PROTECTION CIRCUIT

[75] Inventor: John Willson Dades, Redwood City, Calif.

[73] Assignee: GTE Automatic Electric Laboratories Incorporated, Northlake, Ill.

[22] Filed: Aug. 29, 1975

[21] Appl. No.: 608,864

[52] U.S. Cl. .............................. 325/2; 330/124 D; 340/147 SC
[51] Int. Cl.² ..................... H04B 1/16; H04B 1/38
[58] Field of Search .................. 325/2, 150, 151; 330/51, 124 R, 124 D; 340/147 SC

[56] References Cited
UNITED STATES PATENTS

| | | |
|---|---|---|
| 3,051,788 | 8/1962 | Seeley ........................... 330/124 D |
| 3,305,791 | 2/1967 | Wolfe et al. ......................... 325/2 |
| 3,345,578 | 10/1967 | Shuda .......................... 330/124 D |
| 3,348,163 | 10/1967 | Hirst ............................. 330/124 D |

*Primary Examiner*—Robert L. Richardson
*Attorney, Agent, or Firm*—Leonard R. Cool; Douglas M. Gilbert

[57] ABSTRACT

A diode switch device coupled between two circulators provides signal continuity around an active radio frequency circuit during a failure mode caused by a loss of local supply voltage. Under a normal nonfailed condition, the diode switch short circuits the bypass path, thereby preventing the input signal from bypassing the protected circuit. In the protected failure mode, the short circuit is removed and the input signal is conducted around the failed active circuit.

3 Claims, 2 Drawing Figures

RADIO FREQUENCY PROTECTION CIRCUIT

BACKGROUND OF INVENTION

1. Field of Invention

This invention relates to protection circuits and more particularly to radio frequency (RF) protection circuits for RF amplifiers or like active circuits.

2. Description of the Prior Art

Several methods are used today to protect amplifiers or other active circuits against failures which cause a loss of signal continuity. Redundant amplifiers coupled together at the input and output ports with hybrids or switching circuits are commonly used to protect against a single amplifier failing. If switching circuits are relied upon to provide signal continuity, some form of performance-sensing device with driver circuits to activate the switches are also required. These circuits provide some measure of protection; however, they are expensive and, like the circuit being protected, they are also prone to failure. The power supply driving the active circuits, which includes the protection circuits, is usually protected against failure by power supply redundancy in conjunction with steering diodes. Standby batteries and/or auxiliary generators are also occasionally used.

Relay switches have also been commonly used (double pole, single throw) at an amplifier input and output to provide signal protection. A short circuit path for signal continuity is provided around the amplifier during periods of amplifier failure. Such an arrangement still requires some form of sensing circuit (such as DC bias current or pilot signal level) plus a driver circuit.

FIG. 1 shows yet another arrangement which is used in the microwave frequency band to protect against the failure of a single reflection-type one-port amplifier. The input signal is supplied on path 10 and coupled through circulator 13 to the reflection amplifier 14. Such an amplifier would typically be a tunnel diode amplifier. The amplified signal is returned via path 12 to circulator 13 and conducted out at the output path 11. In the protected mode, the amplifier input goes to an open circuit impedance which offers a poor termination. The signal is simply reflected back to the circulator and out the output path 11. Such an arrangement is not completely effective, however, since the input termination is not always a good open circuit. Consequently, the signal is attenuated more than what would be desired in the protected mode.

An object of the present invention is to provide a new and improved protection circuit in which a two-port microwave amplifier or like circuit is protected against power supply failure by circuit means which operate in response to a drop in the supply voltage or current.

DETAILED DESCRIPTION

Figure 1:
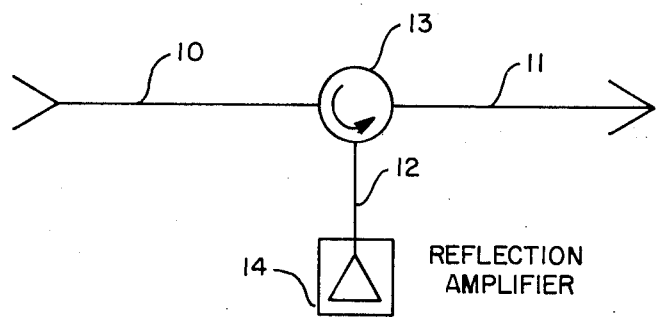
FIG. 1 is a schematic illustration of an amplifier circuit utilizing a prior-art technique of protection.
Figure 2:
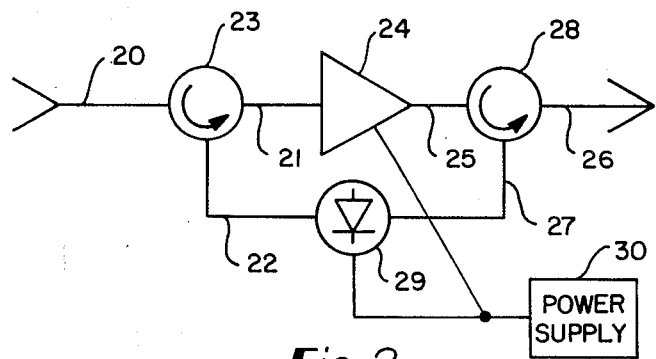
FIG. 2 is a schematic diagram illustrating the preferred embodiment of this invention.

In FIG. 2, the RF amplifier circuit 24 represents the particular circuit which is sought to be protected from failure of the power supply 30. The protection circuit provides a simple signal bypass path around amplifier 24 for periods when the amplifier is inoperable due to loss of supply voltage. The essential element in the bypass circuit is the switching element 29. Preferably, this device should be a PIN diode connected in the bypass circuit as a shunt switch to ground and forward biased for normal (nonfailed) operation. The PIN diode is a silicon junction diode whose P and N trace regions are separated by a layer of intrinsic semiconductor material, usually silicon. At low frequencies, the PIN diode acts as a typical junction diode; however, at radio frequencies rectification ceases due to stored charge in the intrinsic layer and the diode acts like a resistance by conducting current in both directions. When reverse biased or with no supply voltage applied, reverse current flows until the stored charge is depleted, at which time the equivalent resistance becomes a maximum, typically in the order of several thousand ohms.

In normal operation, the input signal is applied via path 20 to RF circulator 23. The orientation of this circulator is such that the signal passes via path 22 to the shunt diode switch 29. The diode switch is biased normally on placing a short circuit to ground across the bypass path, causing the energy to be reflected back to circulator 23 and on to path 21. The amplifier circuit 24 then amplifies the input signal and conducts it to a second RF circulator 28. The orientation of this circulator is such that the output signal is again applied to the shunt diode switch 29 via path 27. As before, the switch reflects the incident energy back to the RF circulator 28. The reflected signal is then applied to the output path 26.

In a failure mode, which is defined as a loss of supply voltage, the amplifier circuit 24 fails and the shunt diode switch no longer provides the short circuit across the bypassed line. With the loss of supply voltage, the diode switch is no longer forward biased, and the equivalent impedance to ground is quite high. The applied signal, instead of being reflected, passes through the diode switch 29 and around amplifier 24. When the supply voltage is restored, the diode switch again becomes forward biased and prevents the signal flow through the bypass circuit. And, the RF amplifier 24 again amplifies the input signal with power restored.

The active amplifier circuit 24 is shown as an amplifier in FIG. 2 only for purposes of illustration. The protection circuit may be used to protect any active circuit where signal continuity is of utmost importance and where there is no frequency shift between the input terminals 20 and output terminals 26. Such a configuration would be particularly useful at a microwave telecommunication repeater of the type disclosed in a previously filed U.S. patent application, Ser. No. 594,419, filed 7/9/1975.

For example, if the microwave repeater provided 25 dB of gain and the microwave system had a gain margin of more than 25 dB, then the loss of power at the repeater would not cause an interruption of service.

The shunt diode switch shown in FIG. 2 as 29 should preferably be a PIN diode since the PIN diode device is a reliable, fast-acting switch that provides good isolation and a good impedance match at the input and output ports. As an alternative, however, a double-pole, single-throw relay could be used capable of operating in the radio frequency region, such as the one manufactured by Teledyne Microwave Corp., part no. CS-33S50-2. A PIN diode, manufactured by Hewlett-Packard Corporation, Palo Alto, California, part no. 3039, would be capable of operating in the protection mode for most applications.

What is claimed is:

1. A radio frequency protection circuit providing a bypass signal path around an active electrical circuit upon the loss of supply voltage, said protection circuit comprising:
    an input terminal for receiving an input RF signal;
    an output terminal for carrying out an output signal;
    an active electrical circuit having an input and output;
    a source of supply voltage;
    a first RF circulator having a first port connected to said input terminal, a second port, and a third port connected to the input of said active electrical circuit;
    a second RF circulator having a first port connected to the output of said active electrical circuit, a second port connected to said output terminal, and a third port; and
    protective circuit means having an input and output, said input coupled to the second port of said first RF circulator and said output coupled to the third port of said second RF circulator, providing an open circuit termination reflecting RF energy during periods of nonfailure of said supply voltage and providing a closed circuit termination conducting RF energy during periods of failure of said supply voltage.

2. A protection circuit as in claim 1 wherein said protection circuit means comprises a PIN diode forward biased during periods of nonfailure of said supply voltage.

3. A protection circuit as in claim 2 wherein said active electrical circuit comprises an RF amplifier.

* * * * *

UNITED STATES PATENT AND TRADEMARK OFFICE
CERTIFICATE OF CORRECTION

PATENT NO. : 3,992,669
DATED : Nov. 16, 1976
INVENTOR(S) : John Willson Oades

It is certified that error appears in the above—identified patent and that said Letters Patent are hereby corrected as shown below:

On the front page, at [75], change inventor's name from "Dades" to -- Oades --.

Signed and Sealed this

Twenty-second Day of February 1977

[SEAL]

Attest:

RUTH C. MASON
*Attesting Officer*

C. MARSHALL DANN
*Commissioner of Patents and Trademarks*